United States Patent [19]

Manring et al.

[11] Patent Number: 4,692,360

[45] Date of Patent: Sep. 8, 1987

[54] METAL INTERLAYERS IN FILMS BY COUNTER-CURRENT DIFFUSION

[75] Inventors: Lewis E. Manring; Stephen Mazur, both of Wilmington, Del.

[73] Assignee: E. I. Du Pont de Nemours and Company, Wilmington, Del.

[21] Appl. No.: 820,234

[22] Filed: Jan. 21, 1986

[51] Int. Cl.⁴ ............................................. B05D 1/18
[52] U.S. Cl. ................................ 427/443.1; 427/189; 427/53.1; 427/123; 427/125; 427/160; 428/458; 428/220
[58] Field of Search .................... 427/443.1, 189, 53.1, 427/123, 125, 160; 428/458, 220

[56] References Cited

U.S. PATENT DOCUMENTS 4,512,855  4/1985  Mazur .................................... 427/12
4,564,424  1/1986  Cassat ................................... 204/20

OTHER PUBLICATIONS

Karl F. Mueller, "Periodic Interfacial Precipitation in Polymer Films", Science, vol. 225, Sep. 7, 1984, p. 1021.

Primary Examiner—Sam Silverberg
Assistant Examiner—Vi Duong Dang

[57] ABSTRACT

This invention relates to counter-current diffusion methods for depositing metals as interlayers within films.

27 Claims, 3 Drawing Figures

5 μm

F I G. 3
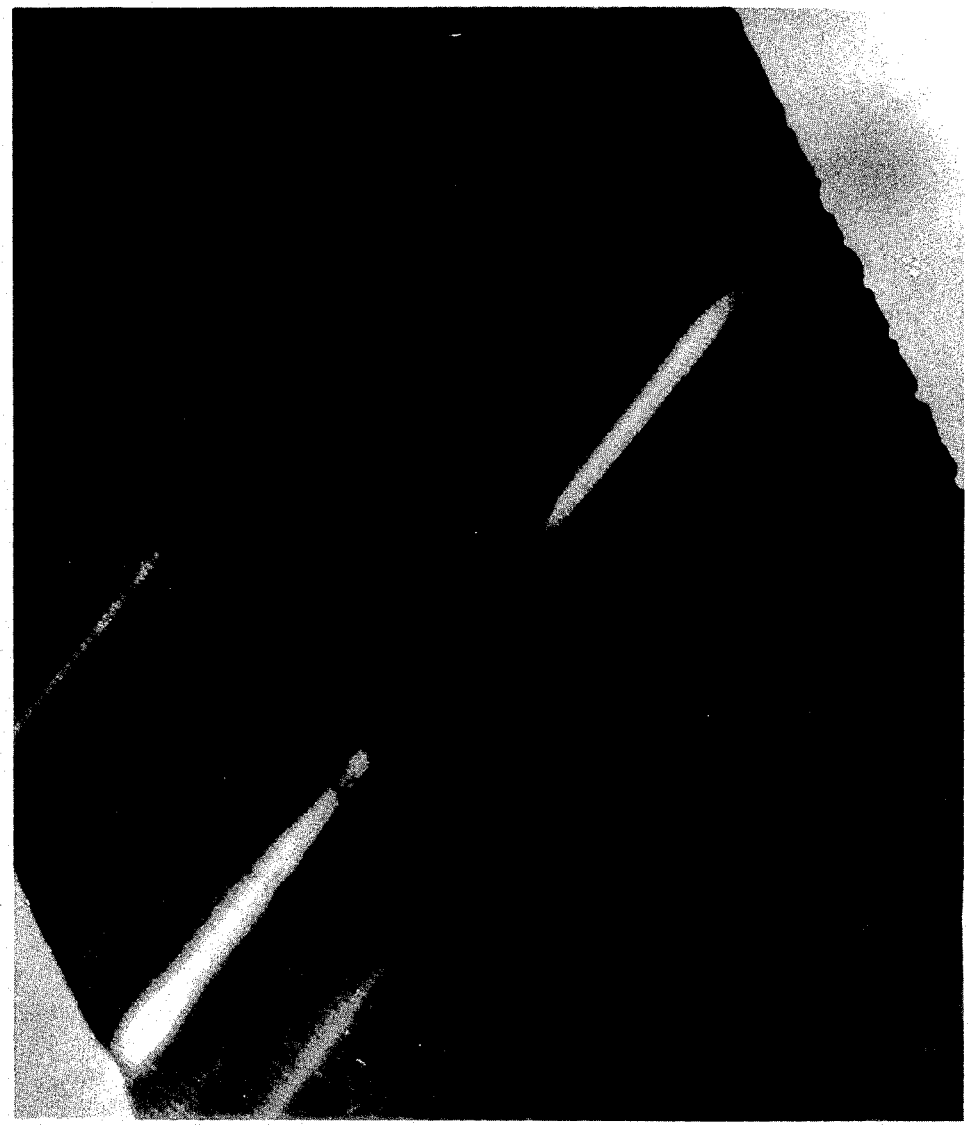
5μm

METAL INTERLAYERS IN FILMS BY COUNTER-CURRENT DIFFUSION

BACKGROUND OF THE INVENTION

1. Field of the Invention

This invention relates to the deposition of metals as interlayers within films.

2. Background of the Invention

Organic polymeric films are often combined with metals (metallized) for various kinds of practical applications requiring such properties as electrical conductivity, optical density or reflectivity. A distinction may be drawn between methods which involve blending metal particles or metal precursors (such as metal salts, see for example, A. K. St. Clair and L. T. Taylor, *J. Appl. Poly. Sci.*, Vol. 28, 2393–2400 (1983); and A. Auerbach, *J. Electrochem. Soc.*, 937, (1984)) with a polymer melt, solution, or latex prior to fabrication of the film, and those methods which combine the metal with a preexisting film. Among the latter methods, we may further distinguish between methods which metallize only a surface of the film (for example, lamination, vapor deposition, or electroless deposition, see R. W. Berry, P. M. Hall, and M. T. Harris, "Thin Film Technology", D. van Nostrand Co., Inc., Princeton, NJ, 1968, pp 1–17) and methods which introduce metals within a preexisting solid polymeric film. By "within" we mean distributed in some volume element between the two surfaces of the film. Said volume element may or may not extend to the external surfaces of the film.

Existing art includes two ways in which metals may be introduced within preexisting solid polymeric films. The most common example is photographic technology (see, for example, A. Roff and E. Weyde, "Photographic Silver Halide Diffusion Processes", The Focal Press, London and New York, 1972, pp 13–31). Conventional photographic methods produce metal particles dispersed within a polymer film wherein their primary purpose is to absorb light. These particles are generally dispersed to such a degree that they do not constitute a continuous phase and therefore lack the macroscopic properties of electrical conductivity and optical reflectivity commonly associated with surface-metallized structures. U.S. Pat. No. 4,512,855 discloses a metal interlayer deposition (MID) process. This process involves reduction of metal ions, diffusing from one surface of a polymer film, by electrons supplied via redox reactions of the polymer, the electrons being supplied from the opposite surface of the film. In this process it is necessary that the polymer be electrochemically active in the sense that it is capable of undergoing reversible redox reactions at appropriate potentials to reduce the metal to its zero-valent state. Among the unique and desirable features of the MID process is the fact that it is capable of producing metal interlayers of sufficient density that they are electrically conductive, and with sufficiently smooth and sharply defined surfaces that they are optically reflective. Typically, under normal operating conditions, only the side of the interlayer facing the solution is sufficiently sharply defined to be reflective, the other surface being obscured by diffusely distributed metal particles.

Precipitation reactions, including some of the simplest sorts of chemical processes, can give rise to remarkably varied and complex morphologies, particularly when they are kinetically coupled to physical transport. For example, consider the reaction between two species A and B to yield an insoluble product C under conditions where either one or both of the reactants is/are supplied by diffusion across a convection-free reaction medium, such as a gel. Many such systems have been studied. The range of morphological complexity observed for C includes examples of periodic multilayers (Liesegang rings), K. H. Stern, Chem. Rev., 54, 79 (1954); large single crystals, H. K. Henisch, "Crystal Growth in Gels", Pennsylvania State University Press, 1970; and dense, sharply defined interlayers (so-called "precipitate membranes"), A. J. Ayalon, Membrane Sci., 20, 93 (1984).

A particular experimental arrangement, which we refer to herein as counter-current diffusion, involves diffusing A and B together from opposite ends of a gel column or the two sides of a film. This situation has been studied by a number of researchers, including A. E. Nielson, A. Hunding and B. Pokric, Croatica Chemica Acta, 50, 39 (1977); D. Srzic, B. Pokric and Z. Pucar, Zeit. Phys. Chem. N. F., 103, 157 (1976); E. P. Honig, J. H. Hengst and P. Hirsch-Ayalon, Ber. Bunsenges. physik. Chem. 72, 1231 (1968); A. C. Allison and J. H. Humphrey, Nature, 183, 1590 (1959); C. J. VanOss, J Colloid and Interface Sci., 27, 684 (1968); and Z. Pucar, B. Pokric and A. Graovac, Anal. Chem., 48, 403 (1974), and certain important generalizations have been established. For example, in cases where a single dense interlayer is deposited, such as $BaSO_4$ precipitation in agar, Honig, Hengst and Hirsch-Aylon, supra, the position of the interlayer is purely kinetically controlled, that is, the position corresponds to the point at which the concentrations of $Ba^{+2}$ and $SO_4^{-2}$ are equal to one another and equal to some minimum critical value. Moreover, this concentration is specifically not given by the equilibrium solubility products rule: $K_{sp}=[C(A)][C(B)]$. In fact, the critical concentration may exceed the equilibrium solubility by many orders of magnitude, Srzic, Pokric and Pucar, supra.

Studies of counter-current precipitation in polymer films have been less extensive than in gels. Although the formation of a $BaSO_4$ interlayer in cellulose film has been reported long ago, P. Hirsch-Ayalon, Rec. Trav. Chim., 75, 1065 (1956), the morphology of that interlayer was not characterized. One such example in cellophane was reported to be only a few $\mu m$ thick; however, neither the thickness of the film nor the position of the interlayer was given, Honig, Hengst and Hirsch-Ayalon, supra. A report, K. F. Mueller, Science, 225, 1021 (1984), concerning precipitation of insoluble salts in poly(vinyl alcohol) films includes an example of complex multilayer formation (similar to Liesegang rings). It appears that, to a certain extent, the dimensions of precipitated interlayers scale with the thickness of the reaction medium.

It is an object of this invention to provide a process by means of which zero-valent metal can be deposited within a film. Another object is to provide a process by means of which, if desired, the metal can be deposited as an interlayer within the boundaries of the film surfaces. Another object is to provide a process by means of which the position of the interlayer in the film can be systematically controlled so as to be any finite distance from the surface of the film. Still another object is to provide a process by which multiple interlayers can be deposited within a single film in a systematically controlled manner. A further object is to provide control over the width of the resultant interlayer by changing the chemical reaction rate between the metal ion and the reducing agent. Still another object is to provide a process which, if desired, will yield a metal interlayer having sufficient density, continuity and surface regularity to exhibit electrical conductivity and optical reflectivity which are characteristic of bulk metallic phases or surface coatings. A further object of the invention is to provide a process that does not require an electroactive polymer, that can be carried out in a single step on a free standing film of variable geometry, and that can be used to produce interlayers having sharp boundaries so as to make the film more reflective on both sides. These and other objects will become apparent hereinafter.

BRIEF DESCRIPTION OF THE DRAWINGS

FIG. 3. Silver interlayer in PMDA/ODA produced by counter-current diffusion of 0.01 N $AgBF_4$ and 0.01N $NaBH_4$ in dimethylformamide (Example 5).

DETAILED DESCRIPTION OF THE INVENTION

Figure 1:
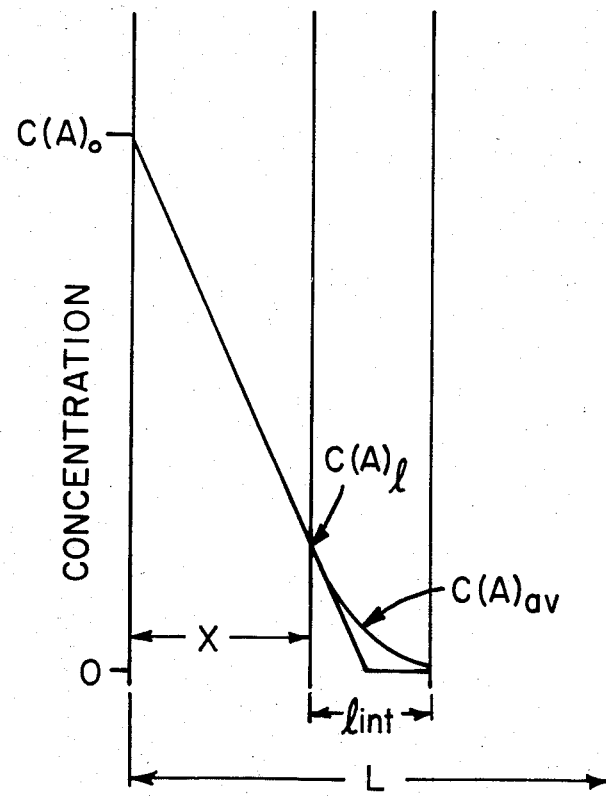
FIG. 1. Diffusion of reactant A into a film. The lower gradient within the film represents an ideal case where 100% of the reaction occurs at L/2. The curved gradient within the film represents a more realistic picture of what is expected.

For further comprehension of the invention and of the objects and advantages thereof, reference may be made to the following description, including the examples and the accompanying drawings in which the various novel features are more particularly set forth.

The present invention comprises the deposition of metal interlayers within a film by means of reacting metal ions diffusing from a solution in contact with one side of the film with a soluble reducing agent diffusing from a solution in contact with the opposite side of the film. In one sense the invention resides in an extension of metal interlayer deposition to include films which do not possess appropriate redox characteristics to carry electrons themselves (electrochemically inactive films). In another sense the invention resides in a process for creating electrically conductive and/or optically dense and/or optically reflective interlayers within a preexisting, free standing film, provided that the film fulfills certain requirements which will be made clear in the discussion which follows.

The metal interlayers of the present invention resemble those created by electrochemical deposition in that they are composed of microparticles of metal packed together within some narrow laminar region of the film. The electrical conductivity of such an interlayer, as formed, is less than that of the same metal in the bulk state, for example, 5 to 10% that of the bulk metal. However, it is noteworthy that for certain combinations of metals and films, the electrical conductivity of the interlayer may be decreased or increased by sintering at temperatures below the decomposition temperature of the film. The use of sintering to improve the electrical continuity of electrochemically deposited interlayers has been disclosed in copending application Ser. No. 657,011 filed Oct. 2, 1984. This feature provides a means to manipulate electrical and optical properties of entire samples or else portions of a sample which can be heated locally, for example, by means of exposure to a laser. The sinterability of interlayers produced by means of the present invention enhances their utility in applictions requiring electrical conductivity or optical reflectivity.

More particularly regarding the invention herein, it resides in a process by means of which a metal is deposited in its zero-valent state in a spatially-controlled manner within a film having first and second surfaces. Still more particularly, the process comprises supplying ions of the metal to at least a part of the first surface and reducing agent to at least a part of the second surface, the metal ions being in a positive oxidation state and in a coordination state such that they are mobile within the film and are transported through it in the general direction towards the second surface, said reducing agent being mobile within the film and being transported through it in the general direction towards the first surface. The oxidation potential of the reducing agent is negative with respect to the reduction potential of the metal ion. The metal ions and reducing agent(s) can be provided in solutions.

The invention described herein accomplishes interlayer deposition of metals by counter-current diffusion of metal cations and reducing agents. The present invention has advantages over the art, in one or more of the following:

(a) an electroactive polymer is not required;

(b) the process of the invention is carried out in a single step on a free standing film of variable geometry; and (c) the process of the invention can be used to create interlayers with sharp boundaries on both sides, a sharp boundary being one which makes the film more reflective than before interlayer formation.

The present invention provides a process capable of producing, in a single step, a layer of metal completely embedded within a film, that is, an interlayer. By means of this process, it is possible to control both the thickness of the interlayer and its position within the polymer film. Notably, this interlayer may possess sufficient continuity and planarity to exhibit electrical and optical (on both sides) characteristics hitherto available only with surface layers. The rate of the reaction between the metal cation and the reducing agent used in the process controls the width of the interlayer and can be used to adjust the morphology of the resulting metal interlayer.

Sharp, conductive interlayers have utility in conductive and reflective films. Strongly absorbing interlayers of dispersed metal particles can be useful in radiative heat transport as a thin film black body absorber. In this invention the light absorbing species is protected as an interlayer within the film. It would not be possible to disperse metal particles in a polymer which are as small as those obtained herein by counter-current diffusion.

Multiple interlayer formation can be achieved in the present invention by exposing a single film sequentially to more than one combination of metal ion and reducing agent (types and/or concentrations). We have demonstrated experimentally the formation of up to three discrete interlayers by this technique, and it is likely that as many as five or six interlayers can be deposited in a single film. The actual number of interlayers obtainable will be dependent on the desired thickness and position of the interlayers.

Typical metals which can be deposited in accordance with this invention include Cu, Ag, Au, Cd, Hg, Cr, Co, Ni, Pd, Pt, Ga, In, Tl, Sn, Sb, Se and Te; preferably, the metal is Cu, Ag, Au or Hg. Ions of the following metals are reduced rapidly in water and, presumably, also in other protic solvents: Ag, Au, Hg, Co, Ni, Pd, Pt, and Sn. Rapid reduction means that the metal is reduced before it can emerge at the opposing surface of the polymer. The importance of this requirement is discussed at length hereinafter. The metal cations are not as rapidly reduced in polar aprotic solvents. Thus, only Ag, Au, Hg, Pt and Pd ions will be reduced at a fast rate by NaBH$_4$ in polar aprotic solvents.

Organic polymers which are useful as film components in the process of the invention include any film-forming organic polymers which are appropriately permeable to the reducing agents and metal salts. These include polyimide and cellulose, these being preferred. Also expected to be effective are poly(vinyl alcohol), cellulose acetate, poly(hexamethylene adipamide), polyacrylonitrile, polyvinyl chloride, polyvinyl fluoride and polyvinylidene fluoride.

The reducing agents used in the process of this invention must be able to reduce the metal ion at an appropriate rate, discussed at length hereinafter. Reducing agents stronger than borohydrides that should be effective in this invention include aluminum hydrides. The anions of hydroxyquinones, for example, p-hydroxyphenolate and p-aminophenolate will reduce some metal ions, for example Ag$^+$ and Hg$^{++}$ in protic solvents.

By "interlayer" is meant a discrete laminar region embedded within, and parallel to, the film, the laminar region being thinner in the transverse direction than said film and the density of the metal within said region being greater than the density of metal on either side of the region. By employing the principles disclosed herein, the interlayer can be produced at various distances from the surfaces of the film within 1000 A within a given experiment, or within 4,000–5,000 A between experiments, such as in the various examples provided hereinafter. In preferred embodiments of the invention, the interlayer may be composed of particles of metal having diameters no greater than 500 A. These particles may be dispersed and disconnected within the interlayer, that is, they may be present in the film in any amount greater than 0%. For most practical applications they should be present in an amount which is at least 18% by volume. In particularly preferred embodiments of the invention the particles can be packed to a density which is as high as 65 percent of the density of the bulk metal. In a preferred embodiment the thickness of the polymeric film is 2 to 100 μm (depending on film type) and the thickness of the interlayer is 0.3 to 10 μm (depending on film type). In further preferred embodiments, the film is a polyimide film and the metal is silver.

The MID process of this invention is particularly useful in that the laminar structure of film/interlayer/film is produced from a film in a single step or operation. Moreover, the structure can exhibit physical characteristics which render it useful for a variety of different applications. For example, films containing interlayers composed of diffusely distributed microparticles can be optically homogeneous, that is, the particles do not scatter light because they are much smaller than the wavelength of the light, but the optical density of the films can be very high, greater than 4.0, due to absorption of light by the metal, rendering them useful as optical filters. In another embodiment the interlayer can be prepared with a high density of metal such that the metal forms an electrically continuous phase which is capable of carrying an electrical current. The electrically-conductive interlayer can be prepared with a sharply-defined smooth interface on both sides with the surrounding film, such that the interface is optically reflective as a mirror on both sides. The electrically-conductive, optically-reflective interlayers offer advantages over first-surface metallic coatings deposited by conventional art processes because they are resistant to abrasion, being internal to the film. The interlayers of the invention also offer advantages over laminated structures prepared, for example, by a stepwise procedure, because the interface between the interlayer and the polymer can be maintained optically flat and shows no tendency to delaminate. Structures produced by the MID process of the invention possess utility for reflective, electrically-conductive, abrasion-resistant coatings which may be used for electrical, optical or radiant heat shielding.

As will be apparent to one skilled in the art, metal ions can be rapidly reduced to the zero-valent state when they encounter reducing agents of sufficient reducing potential. The position of metal deposition is, therefore, dependent on the experimental variables which determine the fluxes of metal ions and reducing agents from opposing surfaces of the film. The MID process of the invention relies on control of these counter-directional fluxes. In a preferred mode of operation the fluxes of reducing agent and metal ions are both maintained constant, that is, under steady-state conditions, during the formation of the interlayer. Depending on the experimental conditions and the properties of the film and the metal ions employed, different steady-state conditions may prevail. For example, raising the concentration of metal ions in solution causes interlayer deposition to occur deeper within the film, that is, closer to the interface with the reducing agent, whereas increasing the concentration of reducing agent causes deposition to occur closer to the interface with the metal ion source. Correlations of this sort hold only within the limits of reducing agent and metal ion flux dictated by the film itself, as discussed further herein.

In another preferred embodiment the supply of reducing agent and/or metal ions can be restricted to particular regions of the film's surfaces such that the interlayer is formed as a two-dimensional pattern. Any or all of the parameters discussed above can be changed while carrying out the process in order to obtain complex metal patterns, such as multiple layers of varying thickness, density and position within the film. These features of the invention provide utility for the manufacture of electrically-conductive circuit patterns or metallized images.

In order to be utilized in the process of this invention, the film must be sufficiently permeable that the flux of the metal ions is balanced by the flux of reducing agent. The mobility of the reducing agent and metal ion in the film depends not only on their charge and size, but also on the coordination environment and state of aggregation, so that the solvent and counterions may also be important in this regard. For example, a given metal ion having a particular counterion (anion) may have insufficient mobility to be operable in the process of the invention, whereas the same metal ion (in the same oxidation or valence state) having a different counterion (anion) may have sufficent mobility and thus be operable. As with many other examples of transport phenomena, and as apparent from the above, these requisites are not solely dictated by the chemical constitution of the polymer, such as molecular structure and molecular weight, but they are also strongly influenced by its physical state, including but not limited to density, orientation, and extent of crystallinity. For example, a dense, highly crystalline polymer film may have insufficient metal ion and/or reducing agent permeability to be operable herein, whereas an amorphous film of the same polymer may perform well. Under steady-state conditions the time required to deposit a particular thickness of interlayer increases proportionately with the thickness of the film, all other conditions being equal.

A preferred polymer for use herein is a polyimide, especially a polyimide of 4,4'-oxydianiline (ODA), also referred to as 4,4,'-diaminodiphenyl ether, and pyromellitic dianhydride (PMDA), also referred to as pyromellitic anhydride. A preferred method for producing such a polyimide comprises treating the appropriate polyamic acid having an $\eta_{inh}$ of 0.40–1.7 dl/g with a 50/50, by volume, mixture of acetic anhydride and pyridine at room temperature.

We shall assume that transport is governed by simple diffusion. Thus the flux F along a coordinate x perpendicular to the film plane is given by Fick's first law: $F = -DdC/dx$, where D is the diffusion coefficient for the reagent and C is the reagent concentration. The permeability constant P is related to D by equation 1:

$$P_f = D_f[C_o/C_s]$$

wherein:

$P_f$ is the permeability of the reagent through the film;
$C_o$ is the concentration of solute at the juncture of the film and solution just within the surface of the film;
$C_s$ is the concentration of reagent in the bulk solution; and subscripts denote position.

We will define x=0 as the surface of the film in contact with the metal salt solution. Success of the process is dependent upon the flux of metal salt, $F(m)_f$, being equal (and opposite in sign) to the flux of the reducing agent, $F(r)_f$, at some location x=1 within the film. According to Fick's law $F(m)_f$ and $F(r)_f$ are given by:

$$F(m)_f = D(m)_f dC(m)/dx$$

$$F(r)_f = D(r)_f dC(r)/dx.$$

Under steady state conditions $F(m)_f$ and $F(r)_f$ are constants and $F(m)_f = -F(r)_f$ at x=1. Moreover, if we assume that the concentration of metal ion and reducing agent are negligible at 1 (due to fast reaction between the metal ion and reducing agent) then the reactant fluxes are described by equation 2:

$$F(m)_f = D(m)_f C(m)_o/l = (D(r)_f C(r)_o/(L-l)) = -F(r)_f$$

wherein:

L is the thickness of the polymer film;
$C(m)_o$ is the concentration of metal at the juncture of the film and solution (x=0) just within the surface of the film;
$C(r)_o$ is the concentration of reducing agent at the juncture of the film and solution (x=L) just within the surface of the film.

With these assumptions, combination of equations 1 and 2 yields equation 3 which predicts the relative position of the metal interlayer given the initial solution concentrations and the permeabilities of metal salt and reducing agent:

$$l_I/L = P(m)_f C(m)_s/[P(m)_f C(m)_s + P(r)_f C(r)_s] \quad Eq.\ 3$$

wherein:

$l_I$ is the distance of the interlayer from the side of the film that species m (with concentration $C(m)_s$ in solution) diffuses into the film;
L is the thickness of the film; and
$P(m)_f$ and $P(r)_f$ are the permeabilities of species m and r, respectively, in the film.

If $P_fC_s$ for one of the reactants is considerably greater than $P_fC_s$ for the other, product formation will occur at the surface away from the fast diffusing species. For example, if $P_fC_s$ for species m is fifty times that of species r $((P(m)_fC(m)_s = 50P(r)_fC(r)_s)$, equation 3 predicts an interlayer will form 98% of the distance across the film. Since the interlayer will have a finite thickness, it is inevitable that the interlayer will break through the surface under these conditions. This will be observed at even smaller ratios of $P(m)_fC(m)_s/P(r)_fC(r)_s$ because of concentration polarization at the surface of the film when one of the reactants diffuses over a very short distance.

The problem of concentration polarization of the solution arises because the solution will have a stagnant sublayer of finite thickness ($l_{sub}$) adjacent to the film regardless of how effectively the solution is stirred. Thus, the flux of solute through the stagnant sublayer will be controlled by diffusion only. Increased agitation will not increase the diffusion constant through the sublayer, although it will decrease the thickness of the sublayer. In a film adjacent to a reactant solution of the concentration $C_S$, reactant will diffuse through the sublayer (thickness $= l_{sub}$, diffusion constant $= D_s$) into the film and react inside the film with the co-reactant entering from the opposite face. The concentration of reactant in solution at the film surface, $C_{fs}$, will not be exactly the same as the bulk concentration, $C_s$. The reaction occurs at a distance ($l_I$) into the film (where the reactant concentration will be small) and the reactant has a diffusion constant $D_f$ in the film. The flux through the sublayer must equal the flux into the film, and applying equation 2, equation 4 can be written:

$$P_f = D_f C_{fs}/l_I = D_s[(C_s - C_{fs})/l_{sub}] \quad Eq.\ 4$$

Solving equation 4 for $C_{fs}$ gives equation 5:

$$C_{fs} = D_s l_I C_s/[D_s l_I + D_f l_{sub}] \quad Eq.\ 5$$

Equation 5 indicates that as long as $D_s l_I >> D_f l_{sub}$, no concentration polarization will occur; however, it is apparent that at constant $D_f$, as $l_I$ becomes smaller (for example, if an interlayer is formed too close to one of the surfaces) concentration polarization will be more of a problem. Equation 5 also shows the importance of stirring the solutions in counter-current diffusion experiments to reduce $l_{sub}$ and thereby avoid concentration polarization.

The relationship between the diffusion rates of the reactants and the kinetics of the reaction will effect the width of the interlayer ultimately formed. FIG. 1 diagrams the diffusion of one reactant A into a film of width L. A solution of A at concentration $C(A)_s$ is placed outside of the film and diffuses into the film with a diffusion constant $D(A)_f$. The concentration of A in the solution adjacent to the film is $C(A)_o$. Not shown in FIG. 1 is reactant B which meets A half-way through the film at position L/2 and reacts with A to form C (for simplicity's sake we will assume that $C(A)_o=C(B)_o$ and that $D(A)_f=D(B)_f$). We define a region (reaction region) in the film of thickness $l_{int}$, symmetrically disposed about L/2 within which all of A will react with B. Neither A nor B diffuses past this region. The flux of A into the reaction region will be equal to the reaction rate of A with B. Equation 6 is arrived at by assuming the steady state approximation for C(A) in the reaction region:

$$dC(A)/dt=[D(A)_f d^2C(A)/dx^2]-[kC(A)C(B)]=0 \qquad \text{Eq. 6}$$

wherein k is the second order rate constant for the reaction of A with B.

The concentration of A at the edge of the reaction region is $C(A)_l$ (and will control the flux of A into the reaction region) and the average concentration of A in the reaction region is $C(A)_{av}$. It is obvious that the absolute upper limit for $C(A)_{av}$ is $C(A)_l$, and since we are assuming that $C(A)_o=C(B)_o$ and $D(A)_f=D(B)_f$, $C(A)_l$ will equal $C(B)_l$. Substituting these variables into equation 6 yields equation 7:

$$D(A)_f C(A)_l/l^2_{int}=k(C(A)_{av})^2 \sim KC(A)_l^2 \qquad \text{Eq. 7}$$

The concentration of A at the reaction region edge, $C(A)_l$, is related to $C(A)_o$ by a linear function, equation 8:

$$C(A)_l=C(A)_o l_{int}/L \qquad \text{Eq. 8}$$

Substituting equation 8 into equation 7 and solving for $l_{int}$ yields equation 9 which describes the interlayer thickness ($l_{int}$) as a function of $D(A)_f$, L, k and $C(A)_o$:

$$l_{int} \sim [D(A)_f L/kC(A)_o]^{\frac{1}{3}} \qquad \text{Eq. 9}$$

Equation 9 predicts that the thickness of the interlayer ($l_{int}$) will increase as D (or P) increases and decrease as the reaction rate k increases. These correlations also apply when $C(A)_o$ is not equal to $(BC)_o$ and when $D(A)_f$ is not equal to $D(B)_f$. It is apparent that a certain minimum reaction rate constant, k, is required if a sharp interlayer is to be obtained. It is also apparent that thinner interlayers will be obtained in thinner films, or when higher initial concentrations of reactants are used.

Because of the need to know the relative fluxes of the reactants, it is important to determine the permeabilities of the films towards the reactants. Knowledge of the permeabilities will also assist in predicting the position of the resultant interlayers. It is also advantageous to know the reaction rate k. If both D (or P) and k are known, estimates of the interlayer thickness can be obtained from equation 9.

The following discussion illustrates the determination of permeabilities necessary for effective use of this invention as detailed above:

DIFFUSION OF REACTANTS THROUGH PMDA/ODA POLYIMIDE FILM

Diffusion of reactants through polyimide film was monitored by the increase in conductivity in one half of a U-tube cell (side #2) following addition of a reactant-containing solution to the other half of the cell (side #1). Each half of the cell held 100 mL of solution and the top of the cell opening for each half of the cell was 5.2 cm in diameter. The area of film exposed on each half was 6.47 cm$^2$. The concentration of salt diffusing through the film was measured by a conductivity electrode placed in one half of the cell (the side of the cell housing with the conductivity meter will be designated side #2). The conductivity electrode (Yellow Springs Instrument Co. Inc., cell #3403, cell constant =1.0/cm) was attached to a conductance meter (Yellow Springs Instrument Co. Inc. Model 32), the recorder output from which was sent to a storage oscilloscope (Analogic/Data Precision Model 6000). In side #2 of the cell was placed 100 mL of solvent, a magnetic stirring bar and the conductivity cell. Side #2 of the cell was fitted with a Teflon cap through which the conductivity cell could pass. In side #1 of the cell was placed 70 mL of solvent and the membrane was allowed to equilibrate on both sides with the solvent. After 5 minutes equilibration the 70 mL of solvent in side #1 was removed and 100 mL of solution containing the desired amount of salt was added.

Initially, the appearance of AgBF$_4$ on side #2 of the cell is slow, but after a short lag time the appearance of AgBF$_4$ is a linear function of time, consistent with well established theories of diffusion in polymers and other media, J. Crank, "The Mathematics of Diffusion", 2nd ed., Oxford University Press, Oxford, England, pp. 44–68, 1975. The total amount of a reactant that will diffuse through a plane sheet as a function of time is described by equation 10:

$$Q_t=[PC_s/L]t-[L^2/6D_f] \qquad \text{Eq. 10}$$

wherein:

$Q_t$ is the total amount of reactant that has diffused through the film at time (t);

P is the permeability of the film to the reactant;

$C_s$ is the concentration of the reactant in the solution on side #1 of the cell;

L is the thickness of the film; and $D_f$ is the diffusion constant of the reactant through the film.

A plot of $Q_t$ vs t at times that are much greater than $[L^2/6D_f]$ will be linear with a slope of $P \times C_s/L$. Knowing the concentration of the solution placed in side #1 of the cell and the thickness of the film allows the permeability constant P to be calculated from the slope of the straight line. The data obtained from the above experiment are in the form of mV per second. The output of the conductivity meter was standardized with solutions of known concentrations of the respective salts in the solvents of interest. Values determined for P for AgBF$_4$ and NaBH$_4$ diffusion through polyimide using both acetonitrile and dimethylformamide as solvent are shown in table 1.

Also listed in table 1 is the permeability of a film that has had a silver interlayer deposited in it by 60 minute counter-current diffusion of 0.01N AgBF$_4$ and 0.01N NaBH$_4$ in acetonitrile by a procedure analogous to that described in Example 1. The possibility of depositing multiple interlayers is dependent on the previously formed interlayers being suitably permeable to the reactant solutions.

TABLE 1

| | Diffusion of AgBF$_4$ and NaBH$_4$ Through Polyimide Film Using Acetonitrile and Dimethylformamide as Solvent | | |
|---|---|---|---|
| Salt | C (Salt) | Solvent | Permeability (P, cm$^2$/sec) |
| AgBF$_4$ | 0.10 N | acetonitrile | 2.3 × 10$^{-8}$ |

TABLE 1-continued

Diffusion of AgBF$_4$ and NaBH$_4$
Through Polyimide Film Using
Acetonitrile and Dimethylformamide as Solvent

| Salt | C (Salt) | Solvent | Permeability (P, cm$^2$/sec) |
|---|---|---|---|
| AgBF$_4$ | 0.05 N | acetonitrile | 1.9 × 10$^{-8}$ |
| AgBF$_4$ | 0.01 N | acetonitrile | 1.0 × 10$^{-8}$ |
| AgBF$_4$ | 0.005 N | acetonitrile | 1.0 × 10$^{-8}$ |
| AgBF$_4$ | 0.10 N | dimethylformamide | 6.2 × 10$^{-8}$ |
| AgBF$_4$ | 0.05 N | dimethylformamide | 4.5 × 10$^{-8}$ |
| AgBF$_4$ | 0.01 N | dimethylformamide | 3.3 × 10$^{-8}$ |
| NaBH$_4$ | 0.01 N | acetonitrile | 1.3 × 10$^{-8}$ |
| NaBH$_4$ | 0.10 N | dimethylformamide | 3.8 × 10$^{-8}$ |
| NaBH$_4$ | 0.05 N | dimethylformamide | 4.1 × 10$^{-8}$ |
| NaBH$_4$ | 0.01 N | dimethylformamide | 2.1 × 10$^{-8}$ |
| AgBF$_4$ | 0.01 N | acetonitrile | 4.7 × 10$^{-9}$* |
| NaBH$_4$ | 0.01 N | acetonitrile | 2.9 × 10$^{-9}$* |

*Permeability through film with a silver interlayer present.

Another embodiment of the invention here resides in the discovery that, although the metal particles of the interlayer are conductive, for example, to as high as 5–10 percent of the conductivity of the bulk metal, even higher conductivities can be achieved by sintering, using a technique independently discovered by another and disclosed and claimed in commonly assigned copending application Ser. No. 657,011 filed Oct. 2, 1984. More specifically, marked improvement in the electrical contact between the metal particles of the interlayer has been achieved by sintering the interlayer at such temperature that the polymer is not adversely affected. Furthermore, if a laser is employed to selectively heat limited regions of the metal interlayer, the sintering process is expected to produce two-dimensional patterns consisting of variations of electrical conductivity and/or optical reflectivity and transmissivity. More specifically, mild sintering conditions should increase the electrical continuity between microparticles, resulting in enhanced conductivity and reflectivity, while more extreme conditions, as obtained, for example, from more intense laser exposure, should result in formation of isolated particles whose diameters exceed the thickness of the original interlayer, with a consequent loss in electrical conductivity and reflectivity but an increase in transmissivity.

Still more specifically, another embodiment of the invention herein resides in a sintered metal interlayer, or a plurality of such interlayers, within a film, the unsintered interlayer(s)/organic polymeric film being of the type described hereinabove. Thus, there is provided a means for adjusting the electrical conductivity of the interlayer in a continuous fashion, in situ, from its initial value to the value for the bulk metal, and in a discontinuous fashion to a lower limit equal to the electrical conductivity of the polymer matrix. Moreover, the optical reflectivity of a surface of the interlayer can be altered by the sintering process in a continuous fashion from its initial value to an upper limit corresponding to the reflectivity of the bulk metal, and in a discontinuous fashion to a lower limit of zero. These changes may be brought about by thermally sintering the microscopic metal particles which make up the interlayer. This sintering may involve heating the entire sample, or it may be accomplished in a spatially regulated manner by exposing selected regions of the interlayer to a heat source, for example, by irradiating with a laser. When exposed to laser radiation in excess of that whereby the maxima of conductivity and reflectivity have been achieved, the interlayer can be disintegrated, in a spatially controlled manner, into isolated metal particles, resulting in loss of electrical conductivity and optical reflectivity in the overexposed areas. Provided that the laser is of a wavelength which is not strongly absorbed by the polymer, both kinds of transformation can be achieved without apparent decomposition of the polymer.

EXAMPLE 1

Silver Metal Interlayer Formation in PMDA/ODA Polyimide Using Acetonitrile as Solvent A. Polyamic acid was prepared from 4,4,'-oxydianiline (ODA) and pyromellitic dianhydride (PMDA). A 12 wt. % solution of the polyamic acid in dry N,N-dimethylacetamide (DMAc) was filtered through a Millipore (10.0 μm pore) filter. A clean glass plate (10.3 cm diameter) was sprayed with a release agent (Frekote, Frekote Inc., 2301 N.W. 30th Place, Pompano Beach, FL 33060) and then spin coated with the polyamic acid solution using a Headway Research Inc. Model EC101D Photoresist Spinner at 860 rpm. The plate was transferred to a hot plate at 80° C. for a period of 10 minutes until the polymer formed a clear colorless film. The film was converted to the polyimide structure by immersing the plate in a mixture of acetic anhydride and pyridine (equal parts by volume) for a period of two hours at room temperature. During conversion to the polyimide the film acquired a yellow color typical of the PMDA/ODA polyimide. The film was rinsed with methanol and air dried. The film thickness as determined by transmission electron microscopy was 6.2 μm. The film was easily removed intact from the glass plate by slipping a razor blade between the polyimide-glass interface and then lifting the film off by hand. The film was stored on the glass plate until immediately prior to its use.

B. The silver interlayer deposition process was carried out in a U-tube cell into which the film could be clamped such that one half of the U-tube was separated from the other half by the film. The cell consists of two Pyrex ® half-cells between which can be sealed the polymer film which is held in place by two Teflon ® washers and two O-rings. The area of film exposed to the solutions is 6.47 cm$^2$ and is defined by the inner diameter of the Teflon ® washers. During a deposition run, solutions in each half cell were stirred with magnetic stirring bars placed at the bottom of each half cell.

The experiment was begun by simultaneously adding 37 mL of 0.01N AgBF$_4$ in acetonitrile to one half of the cell and 37 mL of 0.01N NaBH$_4$ in acetonitrile to the other half of the cell. The solutions were continuously stirred throughout the experiment. The solutions were allowed to counter-current diffuse for 60 minutes. After this exposure both halves of the cell were quickly emptied and washed with excess acetonitrile. At this point the area of the film exposed to the solutions is reflective on both sides, being slightly more reflective on the side of the film that was exposed to NaBH$_4$. A film made in essentially identical fashion was 31% reflective from the side exposed to NaBH$_4$ and 29% reflective from the side exposed to AgBF$_4$ at 633 nm (He-Ne laser).

A small portion of the film was cut out, potted in an epoxy resin, and microtomed in cross sections 1000 Å thick. Prior to potting, a thin, ca. 1000 Å layer of Au/Pd was sputtered onto the side of the film exposed to AgBF$_4$ in order to recognize its orientation in the micrograph. High resolution transmissiom electron micrographs were recorded, FIG. 2. A dark band of silver particles appeared in the center of the film. Silver was identified in later samples by inductively coupled plasma spectroscopy.

EXAMPLE 2

Time Evolution of the Silver Metal Interlayer in PMDA/ODA using Acetonitrile as Solvent Polyimide film was prepared as described in Example 1. The experiment was begun by simultaneously adding 37 mL of 0.01N $AgBF_4$ in acetonitrile to one half of the cell and 37 mL of 0.01N $NaBH_4$ in acetonitrile to the other half of the cell. The solutions were continuously stirred throughout the experiment and were allowed to counter-current diffuse for various amounts of time. After counter-current exposure both halves of the cell were quickly emptied and washed with excess acetonitrile. Three disks (0.327 cm² each) were punched out of the area of the film exposed to the solutions and analyzed for silver content. The results of the analysis are listed in table 2. Also listed in table 2 are the thickness of the interlayer and the estimated density of silver in the interlayer at the different times. For comparison, the density of pure silver is 10.94 g/cm³.

TABLE 2

Time Evolution of Silver Metal in PMDA/ODA Polyimide from Counter-Current Diffusion of $AgBF_4$ and $NaBH_4$ in Acetonitrile

| Exposure Time (minutes) | Amount of Ag (μg/cm²) | Interlayer Thickness (μm) | Interlayer Density (g/cm³) |
|---|---|---|---|
| 5 | 22.8 | 0.125 | 1.82 |
| 10 | 33.9 | 0.125 | 2.7 |
| 15 | 50.7 | 0.113 | 4.5 |
| 20 | 67.8 | 0.125 | 5.4 |
| 20 | 71.8 | 0.25 | 2.9 |
| 40 | 168.5 | 0.38 | 4.4 |
| 60 | 199.7 | 0.28 | 7.1 |
| 90 | 238.7 | 0.50 | 4.8 |
| 90 | 267.0 | 0.44 | 6.1 |
| 150 | 348.8 | 0.79 | 4.2 |
| 180 | 312.5 | 0.56 | 5.6 |

The data in Table 2 indicate that the amount of silver present increases in a linear predictable fashion for the first 60 to 90 minutes and then starts to level off to a constant amount of 310 to 350 μg/cm². In other words, the interlayer is self limiting and eventually becomes less permeable. A plot of equivalents/cm² vs time for the silver deposition in PMDA/ODA polyimide is linear for the first 60 minutes and when plotted according to equation 10 gives a permeability constant of $2.7 \times 10^{-8}$ cm²sec⁻¹, similar to the value determined directly (see above Table 1).

Example 3

Silver Metal Interlayer Formation in PMDA/ODA Polyimide Using Dimethylformamide as Solvent Polyimide film was prepared as described in Example 1. A larger U-tube cell was used so that the area of film exposed to the solutions was 43.1 cm².

The experiment was begun by simultaneously adding 300 mL of 0.01N $AgBF_4$ in dimethylformamide to one half of the cell and 300 mL of 0.01N $NaBH_4$ in dimethylformamide to the other half of the cell. The solutions were continuously stirred throughout the experiment. The solutions were allowed to counter-current diffuse for 60 minutes, at which time the solutions were quickly removed and the film was washed with excess dimethylformamide. Both sides of the film were black in the areas exposed to the solutions. After potting and microtoming cross sections of the sample, transmission electron microscopy indicated the presence of a broad, disperse interlayer made up of silver particles of fairly uniform size, FIG. 3. Analysis by small-angle x-ray scattering confirmed that the particles were very uniform in size and ~40 Å in diameter.

EXAMPLE 4

Silver Metal Interlayer Formation in Regenerated Cellulose Film Using Water as Solvent Regenerated cellulose film was purchased in the form of dialysis tubing from Fisher Scientific Co., Standard Cellulose Dialysis Tubing, cylinder diameter =2.8 cm, dry thickness =25.4 μm. The tubing was slit down one side and placed in the diffusion cell. The experiment was run with cells which exposed a 6.47 cm² area of the film. The experiment was begun by simultaneously adding 37 mL of 0.01 N $AgBF_4$ in water to one half of the cell and 37 mL of 0.01 N $NaBH_4$ to the other half of the cell. The solutions were continuously stirred throughout the experiment. The solutions were allowed to counter-current diffuse for 10 minutes, at which time the solutions were quickly removed and the film was washed with excess water. After drying in air, the side of the film exposed to $NaBH_4$ was silver gray and the side of the film exposed to $AgBF_4$ was reddish orange. After potting and microtoming cross sections of the sample, transmission electron microscopy of the sample indicated a sharp silver interlayer 0.44 to 0.52 μm thick with some diffuse silver interlayers (bands) on the side of the film that had been exposed to silver. It is likely the diffuse silver particles account for the red-orange appearance of this side of the film since dilute solutions or glasses of small silver particles are known to be red due to Mie scattering, G. Mie, Ann. Physik., 25, 377 (1908).

EXAMPLE 5

Control of Interlayer Positions by Adjusting Reactant Concentrations

Equation 3, supra, indicates that the position of the interlayer can be controlled by adjusting the concentrations of the two reactants. Although this is indeed the case, the ability to predict the exact position of the interlayer in polyimide films is complicated by the mode of preparation of the films. Preparation of the polyimide films as described (vide supra) creates an asymmetric film which is not identical from the two surfaces. Surface #1 (the side of the film that was originally exposed to the air) is not identical to surface #2 (the side of the film that was originally exposed to the glass plate), possibly due to subtle differences in the degree of imidization during chemical conversion or the extent of crystallization of the polymer at the two surfaces. Regardless of the reason for the asymmetry of the film, this difference will effect the interlayer position depending on which reactants are diffused in surface #1 and surface #2. Table 3 compares the observed interlayer position when 0.01N $AgBF_4$ and 0.01N NaBH4 in acetonitrile are counter-current diffused into PMDA/ODA polyimide placed with surface #1 facing the $AgBF_4$ solution or when surface #2 faces the $AgBF_4$ solution.

TABLE 3

Effect of Asymmetry on Silver Interlayer Position in PMDA/ODA Polyimide

| Sample # | Surface Exposed to $AgBF_4$ | Position of Interlayer ($l_I/L$) |
|---|---|---|
| 1 | #1 | 0.62 |
| 2 | #2 | 0.36 |
| 3 | #1 | 0.60 |
| 4 | #2 | 0.39 |

The results in table 3 indicate that although the interlayer position is reproducible when each solution is diffused in from the same surface for each run, the particular surface chosen will effect the position of the interlayer. The position predicted from equation 3 (supra, $l_I/L$, using P values of $1.5 \times 10^{-8}$ and $1.3 \times 10^{-8}$ cm$^2$/sec for $AgBF_4$ and $NaBH_4$, respectively, in acetonitrile) for the interlayer is 0.53.

Table 4 lists the predicted and observed silver interlayer position for a variety of $AgBF_4$/$NaBH_4$ concentration combinations in acetonitrile.

TABLE 4

Predicted and Observed Interlayer Positions for Silver Deposition in PMDA/ODA Polyimide

| Sample # | C(NaBH$_4$) | C(AgBF$_4$) | Exposure Time (Minutes) | $l_I/L$ Predicted | $l_I/L$ Observed |
|---|---|---|---|---|---|
| 1 | 0.01 N | 0.01 N | 20 | 0.47 | 0.71 |
| 2 | 0.005 N | 0.01 N | 40 | 0.63 | 0.81 |
| 3 | 0.002 N | 0.01 N | 60 | 0.81 | 0.93 |
| 4 | 0.01 N | 0.05 N | 20 | 0.81 | 0.89 |

EXAMPLE 6

Formation of More Than One Interlayer in a Single Film of PMDA/ODA Polyimide

If the initially formed interlayer is permeable to the reactants, then it should be possible to deposit more than one interlayer in a film by counter-current diffusion. Deposition of more than one interlayer requires a change in the point of equal flux of the reactants. This change in the position of equal flux can be effected by quickly changing the reactant concentrations as the deposition is taking place. Another possibility is to stop the deposition, remove the reactant solutions and then add a second set of reactant solutions of different concentrations. The following example uses the latter procedure.

A cell was set up with a PMDA/ODA polyimide film as described in Example 1: The experiment was begun by simultaneously adding 37 mL of 0.01N AgBF$_4$ in acetonitrile to one half of the cell (side #1) and 37 mL of 0.001N NaBH$_4$ in acetonitrile to the other half of the cell (side #2). The solutions were allowed to counter-current diffuse for 60 minutes, at which time the solutions were quickly removed and the film was washed with excess acetonitrile. The side of the film that had been exposed to NaBH$_4$ showed colorful interference patterns, indicating that the interlayer was close to the film surface. Without removing the film from the cell, a second interlayer was deposited close to the other surface by adding 37 mL of 0.01N AgBF$_4$ in acetonitrile to one half of the cell (side #2, opposite to previous exposure) and 37 mL of 0.001N NaBH$_4$ in acetonitrile to the other half of the cell (side #1). The solutions were allowed to counter-current diffuse for 60 minutes, at which time the solutions were quickly removed and the film was washed in excess acetonitrile. After potting and microtoming cross sections of the sample, transmission electron microscopy indicated the presence of two distinct interlayers at the opposing surfaces, each less than 0.2 μm from the surface.

EXAMPLE 7

Measurement of the Rate of Reaction Between Ag$^+$ and BH$_4^-$ in Acetonitrile and Dimethylformamide When small silver particles (<2000 Å) are formed in solution, they have an optical absorption between 300 and 600 nm with a maximum at ~405 nm. The absorption of light by small silver particles was treated theoretically by Mie, supra, and is described by equation 11:

$$\gamma = \{6\zeta N V n_0^3 / \lambda\}\{3e_2/[(e_1+2n_0^2)^2 + e_2^2]\} \qquad \text{Eq. 11}$$

wherein:

$\gamma$ is the optical absorption coefficient;
$\pi$ is the value for pi;
N is the number density of particles;
V is the particle volume;
$\lambda$ is the wavelength of the light;
$n_0$ is the refractive index of the medium; and
$e_1$ and $e_2$ are the real and imaginary parts of the dielectric constant of the metal spheres. Equation 11 indicates that the total absorbance (area under the absorption spectrum) will be linearly proportional to the amount of silver metal present. At low initial reactant concentrations the appearance of this absorption can be used to monitor the formation of silver from the reaction of NaBH$_4$ and AgBF$_4$. As mentioned hereinabove, the rate of the reaction, k, can be used to estimate the thickness of the resulting interlayer.

The appearance of absorption from 300 to 600 nm after addition of NaBH$_4$ solution to AgBF$_4$ solution was monitored by a Hewlett-Packard Model 8450A Spectrophotometer. This instrument can take a full spectrum from 300 to 600 nm at a rate of one per second. To a 1 cm path-length cuvette was added 1 mL of $4 \times 10^{-4}$M AgBF$_4$ in dimethylformamide and the cuvette was covered with a rubber septum. Two needles were inserted into the septum; one needle was attached to a syringe and the other was present to equalize pressure. To the syringe was added 1 mL of $9.5 \times 10^{-5}$M NaBH$_4$ in dimethylformamide. At time =0, the NaBH$_4$ solution was plunged into the cuvette, the entire 2 mL of solution was quickly withdrawn into the syringe and then replunged into the cuvette. This operation took approximately 2 seconds and thoroughly mixed the two solutions. The appearance of the absorption from 300 to 600 nm was monitored at a rate of 5 seconds per spectrum. By plotting the resulting data as a second order reaction, a second order rate constant of 90M$^{-1}$s$^{-1}$ was obtained.

Equation 9, supra, can be used to predict the width of an interlayer if D (or P), L, C$_o$ and k are known. In Example 3 above, P is approximately $4 \times 10^{-8}$ cm$^2$sec$^{-1}$ (average value for both AgBF$_4$ and NaBH$_4$ diffusion through PMDA/ODA polyimide with dimethylformamide as solvent, table 1), L is 9.9 μm, C$_0$ is assumed equal to C$_s$ which is 0.01M and k is 90 M$^{-1}$sec$^{-1}$, as determined above. Using these values and inserting into equation 9 gives an estimated interlayer thickness of 3.5 μm. FIG. 3 indicates that the calculated interlayer thickness agrees with the observed thickness.

Figure 2:
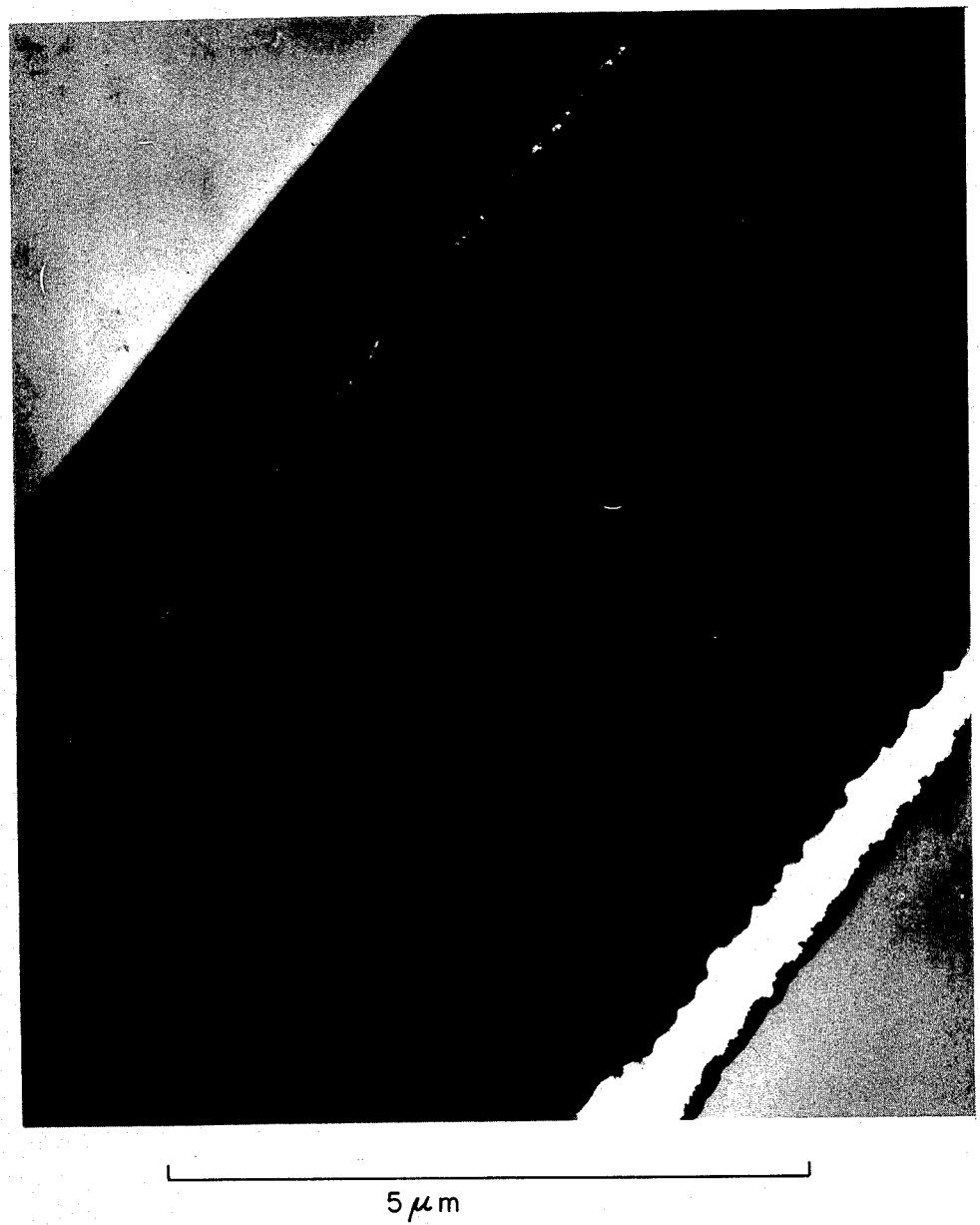
FIG. 2. Silver interlayer in PMDA/ODA produced by counter-current diffusion of 0.01N $AgBF_4$ and 0.01N $NaBH_4$ in acetonitrile (Example 1).

A second order rate constant was determined for the reaction of AgBF$_4$ and NaBH$_4$ in acetonitrile by the same technique as described for dimethylformamide above. The reaction was very much faster in acetonitrile than in dimethylformamide. Because of the time resolution limitations on our experiment (for example, 2 seconds were required to mix the solutions) we can not accurately determine second order rates much faster than 2000M$^{-1}$sec$^{-1}$. For this reason we can only say that the reaction rate in acetonitrile is greater than 2000M$^{-1}$sec$^{-1}$. Insertion of this rate with values of P$\cong$1.5$\times$10$^{-8}$ cm$^2$sec$^{-1}$ table 1), L=6.4 $\mu$m, C$_o$ =0.01M into equation 9 indicates that l$_{int}$ should be less than 0.78 $\mu$m. FIG. 2 indicates that the observed interlayer is indeed smaller than 0.78 $\mu$m. The difference in the rate of reaction of AgBF$_4$ and NaBH$_4$ explains why broader interlayers are formed when dimethylformamide is the solvent rather than acetonitrile and emphasizes the importance of a high reaction rate if a sharp interlayer is desired.

EXAMPLE 8

Measurement of Sheet Resistance for Silver in PMDA/ODA Polyimide Films and for Silver and Copper in Regenerated Cellulose Films The sheet resistance was measured using the "four-point probe" technique of R. W. Berry, P. M. Hall and M. T. Harris, "Thin Film Technology", D. Van Nostrand and Co., Inc., Princeton, N.J. 1968, pp 1–17. In this method four contacts are made to the film in a linear array. Current is passed across the outer two contacts and the resultant voltage drop across the inner two points is measured. The sheet resistance (R$_s$) goes as shown in equation 12:

$$R_s = C(V/I) = (\sigma l_{int})^{-1} \quad \text{Eq. 12}$$

wherein:
C is a constant;
V is the measured voltage drop across the inner contacts;
I is the current passed across the outer contacts;
$\sigma$ is the conductivity, and
l$_{int}$ is the thickness of the interlayer.

Electrical characterizations of the interlayers were made by creating holes in the film at the desired contact points and filling these holes with a conductive paste. The holes were etched in the PMDA/ODA polyimide silver interlayers by plasma etching the sample through a mask. The holes were simply punched in the cellulose films. Table 5 lists the thicknesses and conductivities for interlayers prepared under a variety of condtions (the conditions for sample preparation are listed at the bottom of table 5). For comparison the conductivities of bulk silver and copper are 6.8$\times$10$^5$ ohm$^{-1}$cm$^{-1}$ and 5.9$\times$10$^5$ ohm$^{-1}$cm$^{-1}$, respectively. The conductivity of both the silver interlayers and the copper interlayers can be increased by sintering the samples. Table 5 also lists the conductivities observed after sintering the samples. The interlayers in PMDA/ODA polyimide were sintered for 7 minutes at 300° C., while the interlayers in cellulose were sintered for 10 minutes at 200° C.

TABLE 5

Conductivities of Interlayers

| Sample | Metal | Film | $\sigma$(ohm$^{-1}$cm$^{-1}$) | $\sigma_{sint}$ (ohm$^{-1}$cm$^{-1}$) |
|---|---|---|---|---|
| 1[a] | silver | PMDA/ODA | 6.6 × 10$^3$ | 2.5 × 10$^4$ |
| 2[b] | silver | cellulose | 3.3 × 10$^4$ | 1.4 × 10$^5$ |
| 3[c] | copper | cellulose | 1.2 × 10$^4$ | 2.4 × 10$^4$ |
| 4[d] | silver | cellulose | 1.5 × 10$^4$ | 2.0 × 10$^5$ |
| 5[e] | copper | cellulose | 2.5 × 10$^3$ | — |
| 6[f] | silver (diffuse) | PMDA/ODA | 5 | 700 |

[a]Prepared as described in Example 1;
[b]Prepared by counter-current diffusion of aqueous solutions of 0.01 N AgNO$_3$ and 0.01 N NaHB(OCH$_3$)$_3$ for 20 minutes;
[c]Prepared by counter-current diffusion of aqueous solutions of 0.05 N CuCl$_2$ and 0.05 N NaHB(OCH$_3$)$_3$ for 15 minutes;
[d]Prepared by counter-current diffusion of aqueous solutions of 0.01 N AgNO$_3$ and 0.01 N NaBH$_4$ for 20 minutes;
[e]Prepared by counter-current diffusion of aqueous solutions of 0.05 N CuCl$_2$ and 0.05 N NaBH$_4$ for 15 minutes;
[f]Prepared by counter-current diffusion of dimethylformamide solutions of 0.01 N AgBF$_4$ and 0.01 N NaBH$_4$ for 160 minutes.

EXAMPLE 9

Copper Deposition in a Dialysis Tube by Counter-current Diffusion of CuCl$_2$ and NaBH(OCH$_3$)$_3$ The following experiment provides three embodiments: first, it is a demonstration of copper interlayer deposition in regenerated cellulose film; second, it uses a reducing agent other than NaBH$_4$, and finally, it shows that the invention process is operable with shapes other than planar films. In this experiment the polymer film is replaced by a polymer tube. A solution of one reactant is placed inside the tube while the other reactant solution is placed outside the tube.

An 18 cm piece of dialysis tubing (2.7 cm in diameter when filled with water) with one end sealed was supported in a round glass chamber that was 23 cm long and 8 cm in diameter. To the dialysis tube was added 90 mL of water and 950 mL water was added to the glass chamber. The position of the dialysis tube within the glass chamber was adjusted so the level of the water inside the tube was at the same height as the water in the glass chamber. The bottom of the glass chamber contained a magnetic stir bar that was vigorously stirred during the experiment. An overhead stirrer with a blade paddle was placed inside the dialysis tubing. To further assist circulation of the solution inside the tube, a pump was used to circulate the solution from the bottom of the tube to the top of the tube at a rate of >500 mL/minute. The deposition was started by simultaneously adding 10 mL of 0.5N CuCl$_2$ to the inside of the tube and 100 mL of 0.55N NaHB(OCH$_3$)$_3$ to the outside of the tube. After dilution the concentrations of CuCl$_2$ and NaHB(OCH$_3$)$_3$ were 0.05 N and 0.052N, respectively. The solutions were allowed to counter-current diffuse for 15 minutes, after which time the tube was removed from the glass chamber, the CuCl$_2$ solution was poured out, and the film was washed with excess water. After exposure the film had a copper appearance. After potting and microtoming cross sections of the sample, transmission electron microscopy indicated the presence of a copper interlayer ~1 $\mu$m wide. Analysis showed 237 $\mu$g/cm$^2$ of copper present. The interlayer was conductive with a conductivity of 3.3×10$^4$ ohm$^{-1}$cm$^{-1}$

EXAMPLE 10

Silver Interlayer Formation in a Variety of Polymeric Films Other Than PMDA/ODA and Cellulose 1. Silver in Polyacrylonitrile Polyacrylonitrile films were cast from a 20% polyacrylonitrile in dimethylsulfoxide solution. A silver interlayer was produced in a 0.0038 cm thick film by counter-current diffusion of 0.01N $NaBH_4$ and 0.01N $AgBF_4$ in acetonitrile for four hours. Silver was deposited in a sharp layer ~2 μm from the surface exposed to $NaBH_4$. 2. Silver in Polyvinyl Chloride Polyvinyl chloride films were cast from a 20% polyvinyl chloride in tetrahydrofuran solution. A silver interlayer was produced in a 0.0040 cm thick film by counter-current diffusion of 0.05N $NaBH_4$ and 0.05N $AgBF_4$ in acetonitrile for three hours. The interlayer was ~2 μm from the surface exposed to $NaBH_4$. The polyvinyl chloride films are sensitive to the $NaBH_4$ solution and will degrade upon long exposure.

3. Silver in Polyvinylidene Fluoride

Polyvinylidene fluoride films were cast from a 20% polyvinylidene fluoride in dimethylacetamide solution. A silver interlayer was produced in a 10 μm thick film by counter-current diffusion of 0.01N $NaBH_4$ and 0.01 N $AgBF_4$ in acetonitrile for 12 minutes. The interlayer was ~4 μm from the surface exposed to $NaBH_4$. An interlayer was also produced when 0.01N $NaBH_4$ and 0.01N $AgBF_4$ were counter-current diffused in 50% methanol:50% dimethylformamide for 60 minutes. Sheet resistance of the second interlayer was 5.8 ohms. The methanol was added to the dimethylformamide to increase the second order rate constant for reduction of silver cation by borohydride, vida supra.

4. Silver in Polyvinyl Fluoride

The polyvinyl fluoride films were commercially available from the Du Pont Company. A silver interlayer was produced in a 26 μm thick film by counter-current diffusion of 0.01N $NaBH_4$ and 0.01N $AgBF_4$ in acetonitrile for 60 minutes at 65° C. The interlayer was ~18 μm from the surface exposed to $NaBH_4$. An interlayer was also produced when 0.01 N $NaBH_4$ and 0.01N $AgBF_4$ in 20% ethanol:80% dimethylformamide were counter-current diffused for 20 minutes at 90° C.

BEST MODE FOR CARRYING OUT THE INVENTION

The best mode presently contemplated for carrying out the invention is demonstrated by Examples 1 to 6, 9 and 10.

We claim:

1. Metal interlayer deposition (MID) process by means of which metal is deposited in its zero-valent state within a film having first and second surfaces, the process comprising supplying a solution of ions of the metal to at least part on the first surface and a solution of a reducing agent to at least part of the second surface, the metal ions being in a positive oxidation state and in a coordination state such that they are mobile within the film and are transported in solution through the film in a general direction towards the second surface and the reducing agent being in a negative oxidation state relative to the metal cation and in a coordination state such that it is mobile within the film and is transported in solution through the film in a general direction towards the first surface, the metal ions and reducing agent contacting in a reaction region wherein the metal ions are reduced by the reducing agent to produce a metal interlayer, within the film, having a thickness ($l_{int}$) which is less than the thickness (L) of the film.

2. Process of claim 1 wherein the metal is deposited as particles having diameters no greater than 500 A.

3. Process of claim 1 wherein the reaction rate between the metal ions and the reducing agent is great enough to produce a metal interlayer deposited as a continuous layer having a thickness of approximately up to one tenth that of the film.

4. Process of claim 1 wherein multiple interlayers are formed by exposing the film sequentially to a plurality of metal ion/reducing agent combinations.

5. Process of claim 4 wherein at least two of the metal ion/reducing agent combinations to which the film is exposed are the same except for the concentrations of metal ion and reducing agent.

6. Process of claim 1 wherein the film is an organic polymeric film.

7. Process of claim 6 wherein the organic polymeric film is selected from polyimide, cellulose, poly(hexamethylene adipamide), polyacrylonitrile, polyvinyl chloride, polyvinyl fluoride and polyvinylidine fluoride.

8. Process of claim 6 wherein the metal ions are provided in solution and the metal is selected from Cu, Ag, Au, Cd, Hg, Cr, Co, Ni, Pd, Pt and Sn.

9. Process of claim 6 wherein the reducing agent is provided in solution and the reducing agent is sodium borohydride or sodium trimethoxyborohydride.

10. Process of claim 1 wherein one or both surfaces of the film contains a two-dimensional pattern of impermeable areas and the deposited metal corresponds to the pattern.

11. Process of claim 1 carried out during a long enough period to obtain an interlayer having a density which is as high as 65 percent of the density of the bulk metal.

12. Process of claim 1 carried out during a long enough period to obtain an interlayer having a conductivity of about 5-10% that of the bulk metal.

13. Process of claim 1 wherein the metal is deposited in a continuous layer having a thickness of 0.3 to 10 μm.

14. Process of claim 6 wherein the film has a thickness within the range 2-100 μm.

15. Process of claim 14 wherein the metal is Ag and the film is comprised of a polyimide.

16. Process of claim 14 wherein the metal is Cu and the film is comprised of a polyimide.

17. Process of claim 14 wherein the metal is Au and the film is comprised of a polyimide.

18. Process of claim 15 wherein the film is comprised of a polyimide of 4,4'-oxydianiline and pyromellitic dianhydride.

19. Process of claim 16 wherein the film is comprised of a polyimide of 4,4'-oxydianiline and pyromellitic dianhydride.

20. Process of claim 17 wherein the film is comprised of a polyimide of 4,4'-oxydianiline and pyromellitic dianhydride.

21. Process for modifying in situ the electrical and/or optical properties of the interlayer produced by the process of claim 1, the process comprising heating the interlayer, either in its entirety or in a spatially selective manner, so as to sinter the metal without adversely affecting the properties of the film.

22. Process of claim 21 wherein the interlayer is heated in a spatially selective manner by means of a laser.

23. Process of claim 21 wherein the modification of electrical and/or optical properties provides an increase in electrical conductivity and optical reflectivity, either in the entire interlayer or in selected portions thereof.

24. Process of claim 23 wherein heating is continued until the electrical conductivity and optical reflectivity reach maxima.

25. Process of claim 24 wherein interlayer that has been heated to reach said maxima is heated further in selected portions so as to provide electrical conductivity and optical reflectivity less than the maxima.

26. Process of claim 21 wherein the film is a polyimide of 4,4,'-oxydianiline and pyromellitic dianhydride, the metal is silver, the electrical conductivity of the interlayer is no greater than about $7 \times 10^3$ (ohm cm)$^{-1}$, and the electrical conductivity of the sintered silver is at least $2.5 \times 10^4$ (ohm cm)$^{-1}$.

27. Process for increasing in situ the electrical conductivity and/or the optical reflectivity of an interlayer within a polyimide film, prepared by the process of claim 1, the interlayer being comprised of particulate silver and/or gold, by heating the interlayer, either in its entirety or in a spatially selective manner, so as to sinter the particulate silver and/or gold without adversely affecting the properties of the polyimide.

* * * * *

UNITED STATES PATENT AND TRADEMARK OFFICE
CERTIFICATE OF CORRECTION

PATENT NO. : 4,692,360

DATED : September 8, 1987

INVENTOR(S) : Lewis E. Manring; Stephen Mazur

It is certified that error appears in the above-identified patent and that said Letters Patent is hereby corrected as shown below:

Column 9, Line 25, change "K" to -- k --.

Column 9, Line 41, change "$(BC)_o$" to -- $C(B)_o$ --.

Column 16, Line 17, change "ζ" to -- π --.

Column 19, Line 56, change "on the first" to -- of the first --.

Signed and Sealed this

Nineteenth Day of April, 1988

Attest:

DONALD J. QUIGG

*Attesting Officer*  *Commissioner of Patents and Trademarks*